(12) United States Patent
Tsai et al.

(10) Patent No.: US 8,669,658 B2
(45) Date of Patent: Mar. 11, 2014

(54) CROSSTALK-FREE WLCSP STRUCTURE FOR HIGH FREQUENCY APPLICATION

(75) Inventors: Mon-Chin Tsai, Chu-Tong (TW); Hsiu-Mei Yo, Hsin-Chu (TW); Chien-Min Lin, Taipei (TW); Chia-Jen Cheng, Banciao (TW); Li-Hsin Tseng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 418 days.

(21) Appl. No.: 11/782,384

(22) Filed: Jul. 24, 2007

(65) Prior Publication Data
US 2009/0026608 A1    Jan. 29, 2009

(51) Int. Cl.
*H01L 23/48*    (2006.01)

(52) U.S. Cl.
USPC ........................ 257/737; 257/E23.01

(58) Field of Classification Search
USPC .................. 257/662, 664, 697, 776, E23.067, 257/E23.068, E23.174, 532, 767, 774, 257/E23.01, E21.476
See application file for complete search history.

(56) References Cited

U.S. PATENT DOCUMENTS

| | | | | |
|---|---|---|---|---|
| 5,726,501 | A * | 3/1998 | Matsubara | 257/778 |
| 6,022,787 | A * | 2/2000 | Ma | 438/422 |
| 6,717,071 | B2 * | 4/2004 | Chang et al. | 174/266 |
| 2002/0101723 | A1 * | 8/2002 | Bertin et al. | 361/736 |
| 2006/0001174 | A1 * | 1/2006 | Matsui | 257/774 |
| 2008/0122031 | A1 * | 5/2008 | DeNatale et al. | 257/532 |

\* cited by examiner

*Primary Examiner* — Vongsavanh Sengdara
(74) *Attorney, Agent, or Firm* — Slater & Matsil, L.L.P.

(57) ABSTRACT

A structure, a system, and a method for manufacture of crosstalk-free wafer level chip scale packaging (WLCSP) structure for high frequency applications is provided. An illustrative embodiment comprises a substrate on which various layers and structures form circuitry, a signal pin formed on the substrate and coupled with the circuitry, a ground ring encircling the signal pin, and a grounded solder bump coupled to the ground ring.

11 Claims, 13 Drawing Sheets

CROSSTALK-FREE WLCSP STRUCTURE FOR HIGH FREQUENCY APPLICATION

TECHNICAL FIELD

The present invention relates generally to a system, a structure, and a method of manufacture for a semiconductor device, and more particularly to a system, a structure, and a method of manufacturing a crosstalk-free, chip scale package (CSP) for high frequency applications.

BACKGROUND

Advances in semiconductor manufacturing technology have allowed for reduction in device feature sizes, increases in IC integration levels, and the implementation of devices with processing speeds of CPUs in the gigahertz (GHz) range. The circuit density and operating speed of device packaging may need to be adapted to accommodate these device developments. The electromagnetic compatibility of device packages accommodating these high frequencies may be a dominant factor affecting packaging developments.

One of the problems of electromagnetic compatibility is crosstalk. Crosstalk generally is the unwanted propagation of noise or interference between transmission lines. On a semiconductor device these transmission line terminations are typically termed pins or ports. Crosstalk is a measure of the effect of a signal on one pin influencing the signal on other pins. Crosstalk is usually expressed in dB and is associated with a signal frequency. In general, crosstalk increases as the signal frequency increases. The pins of the semiconductor device are typically coupled to a package. The package is more easily connected to circuit boards or other device systems.

A chip scale package (CSP) is a type of integrated circuit chip carrier that has no pins or wires but uses contact pads instead. To be considered a CSP, a package must have an area no greater than 1.2 times that of the integrated circuit chip being packaged.

The die may be mounted on an interposer upon which pads or balls are formed, as in ball grid array (BGA) packaging and flip chip BGA packaging, or the pads may be etched or printed directly onto the substrate, resulting in a package very close to the size of the silicon die. A package in which the entire assembly process is completed at the wafer level is termed a WLCSP (Wafer-level Chip Scale Package). Similar to the FBGA (Fine Ball Grid Array) package, a WLCSP package has pin connections arranged into a grid on the rear face of the package. In contrast to the FBGA, the WLCSP package size is smaller and closer to the size of the chip. However, as the package size decreases, the crosstalk between pins, especially at high frequency, may cause system instabilities.

SUMMARY OF THE INVENTION

This and other problems are generally solved or circumvented, and technical advantages are generally achieved, by preferred embodiments of the present invention, which present a structure, a system, and a method for a crosstalk-free CSP structure in a high frequency application. An illustrative embodiment of the method of manufacture for a crosstalk-free WLCSP structure in a high frequency application is provided. The method comprises forming a signal pin on a semiconductor substrate in which pluralities of layers comprise circuitry, coupling the signal pin with the circuitry, encircling the signal pin with a ground ring, and coupling the ground ring to a grounded solder ball.

An advantage of an illustrative embodiment of the present invention is that the package may be crosstalk-free in a high frequency application. The foregoing has outlined rather broadly the features and technical advantages of the present invention in order that the detailed description of the invention that follows may be better understood. Additional features and advantages of the invention, which form the subject of the claims of the invention, will be described hereinafter. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a two pin signal system. The invention may also be applied, however, to a plurality of pin signal systems.

Figure 1:
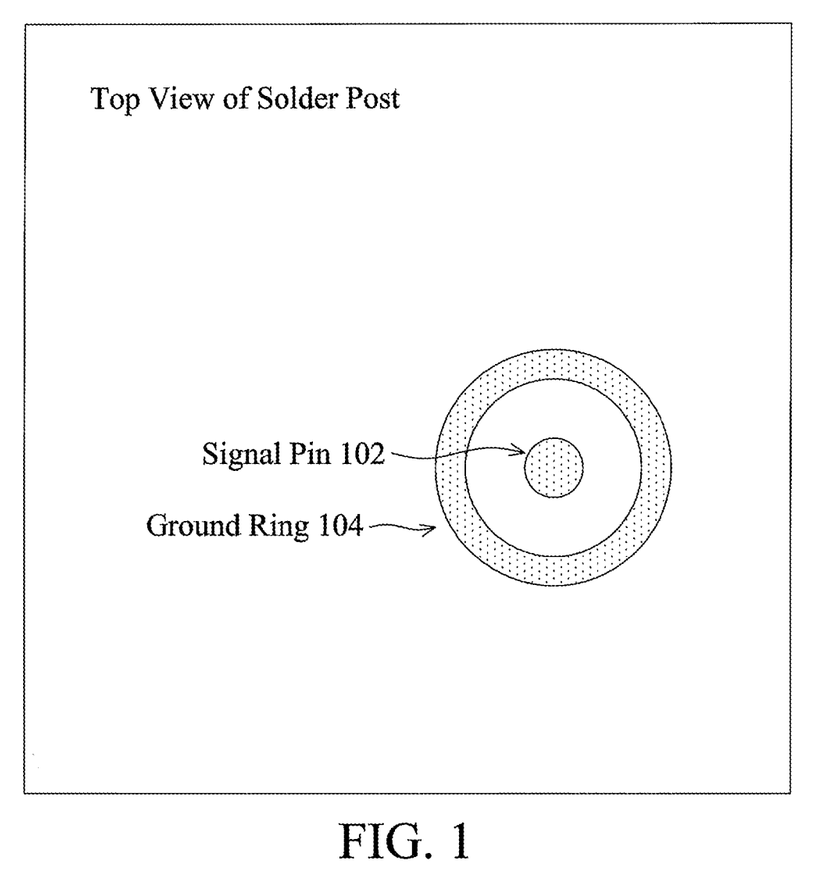
FIG. 1 is a top view of a ground ring shielding a signal pin.

With reference now to FIG. 1, a top view of a ground ring shielding a signal pin is shown. Signal pin 102 is depicted in the center of a ground ring 104. The signal pin may be of a conventional design or may be of a Cu post structure. Ground ring 104 is shown in a circular shape, however ground ring 104 may be square, oval or irregularly shaped. Ground ring 104 must be a substantially closed loop to provide the desired shielding. In addition, ground ring 104 may be a double or multiple ring design. The minimum/maximum distance between the ground ring and signal pin will depend on the process resolution, for example, 15 μm may be an appropriate spacing. The ground ring width may range from 5 μm to 50 μm.

Figure 2A:
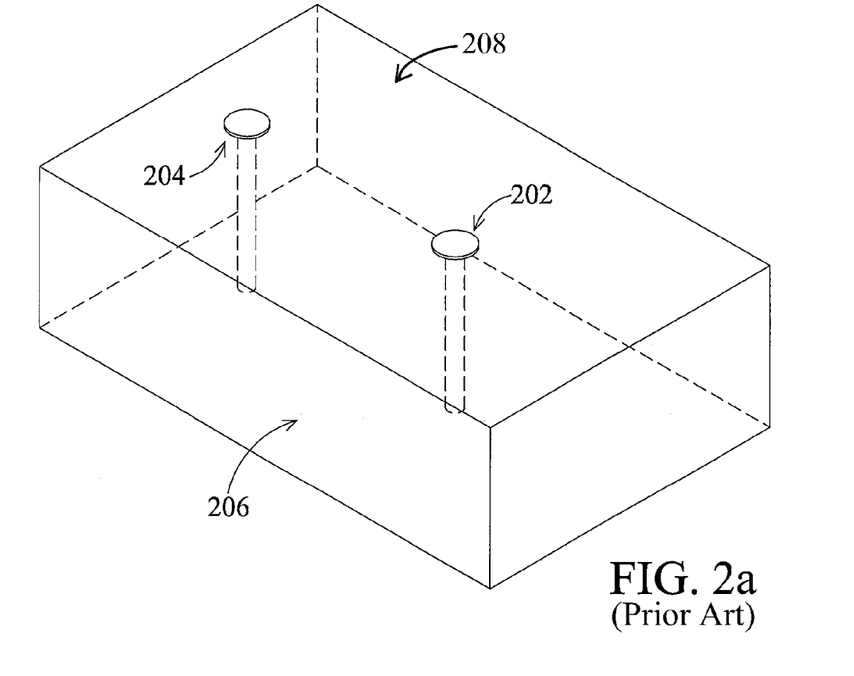
FIG. 2a is a two plane schematic of a known two pin signal system without the ground ring.
Figure 2B:
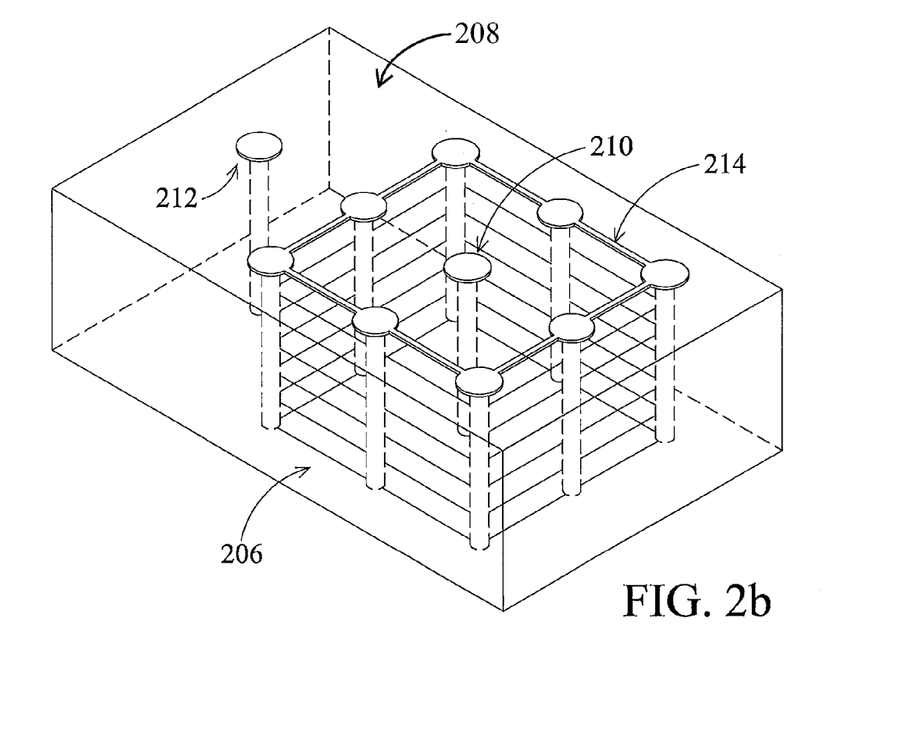
FIG. 2b is a two plane schematic of a two pin signal system with a ground ring encircling a signal pin in accordance with an illustrative embodiment.

FIG. 2a is a two plane schematic of a two pin signal system without the ground ring and FIG. 2b is a two plane schematic of a two pin signal system with a ground ring encircling a signal pin in accordance with the illustrative embodiments. FIG. 2a depicts two planes of a two pin system. Upper plane 208 illustrates the external connections of the device and lower plane 206 depicts the device substrate. Signal pin 202 and quiet pin 204 are shown extending from upper plane 208 to lower plane 206. There is no shielding in this known configuration. The high frequency signals from signal pin 202 may cause crosstalk on quiet pin 204. The higher the frequency signals, the more serious the crosstalk may become.

FIG. 2b again depicts a two plane system. In this configuration, signal pin 210 is shielded from quiet pin 212 by ground ring 214. Ground ring 214 may be comprised of a plurality of interconnected pins extending from upper plane 208 to lower plane 206 or ground ring 214 may be a "wall" encircling signal pin 210. Ground ring 214 is comprised of conductive material, thereby shielding signal pin 210 in a coaxial configuration. Signal pins and quiet pins may not be adversely affected by increases in frequency.

Figure 2C:
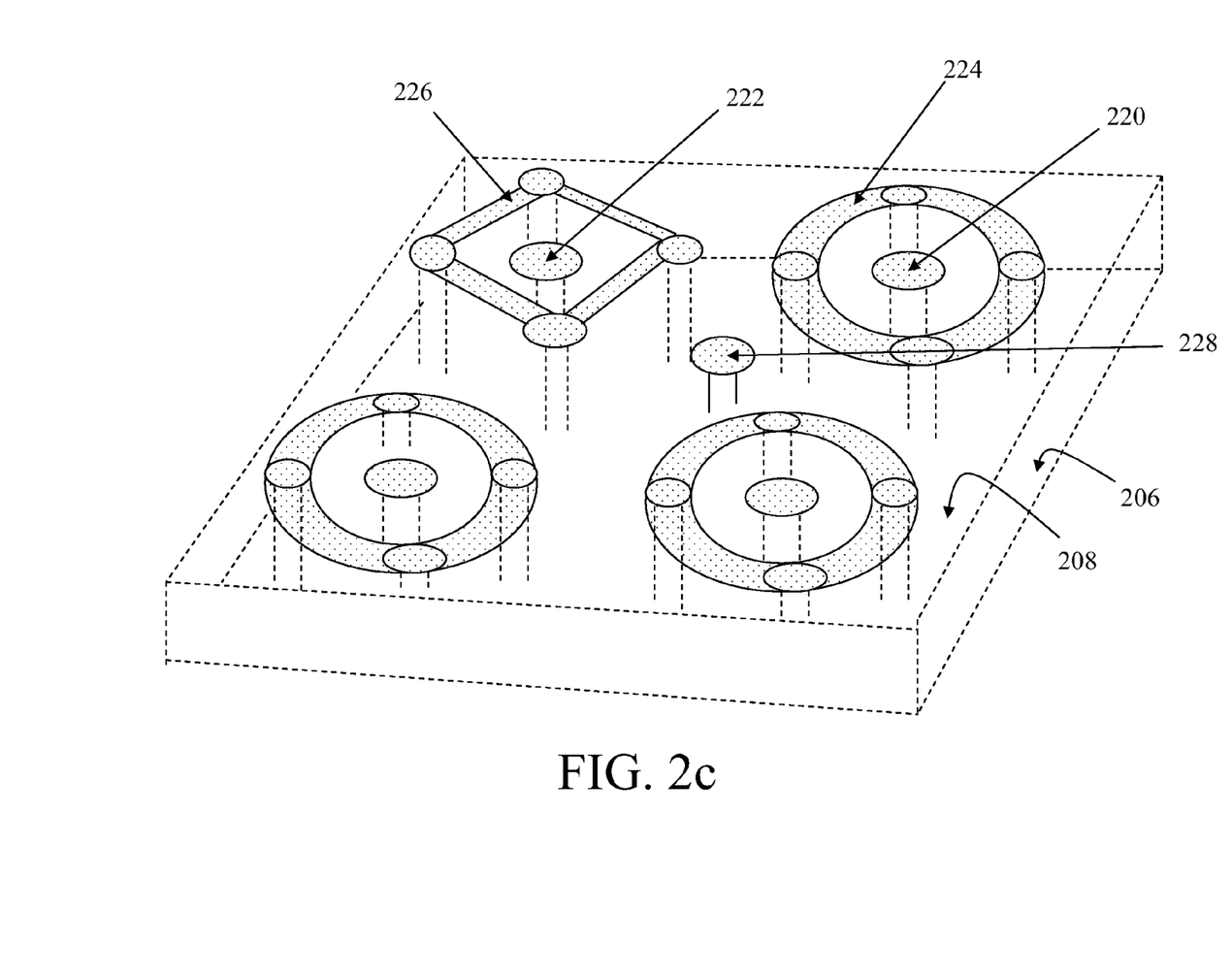
FIG. 2c shows an illustrative embodiment of a single substrate with multiple signal pins and ground rings, in accordance with another illustrative embodiment.

FIG. 2c shows an embodiment with multiple signal pins and ground rings on a single substrate. Multiple ground rings, such as ground rings 224 and 226, encircle multiple signal pins, such as signal pin 220 and 222. There may be one quiet pin, such as quiet pin 228, multiple quiet pins, or no quiet pins in an embodiment. Ground rings on a single substrate may be of dissimilar shapes such as ground rings 224 and 226.

Figure 2D:
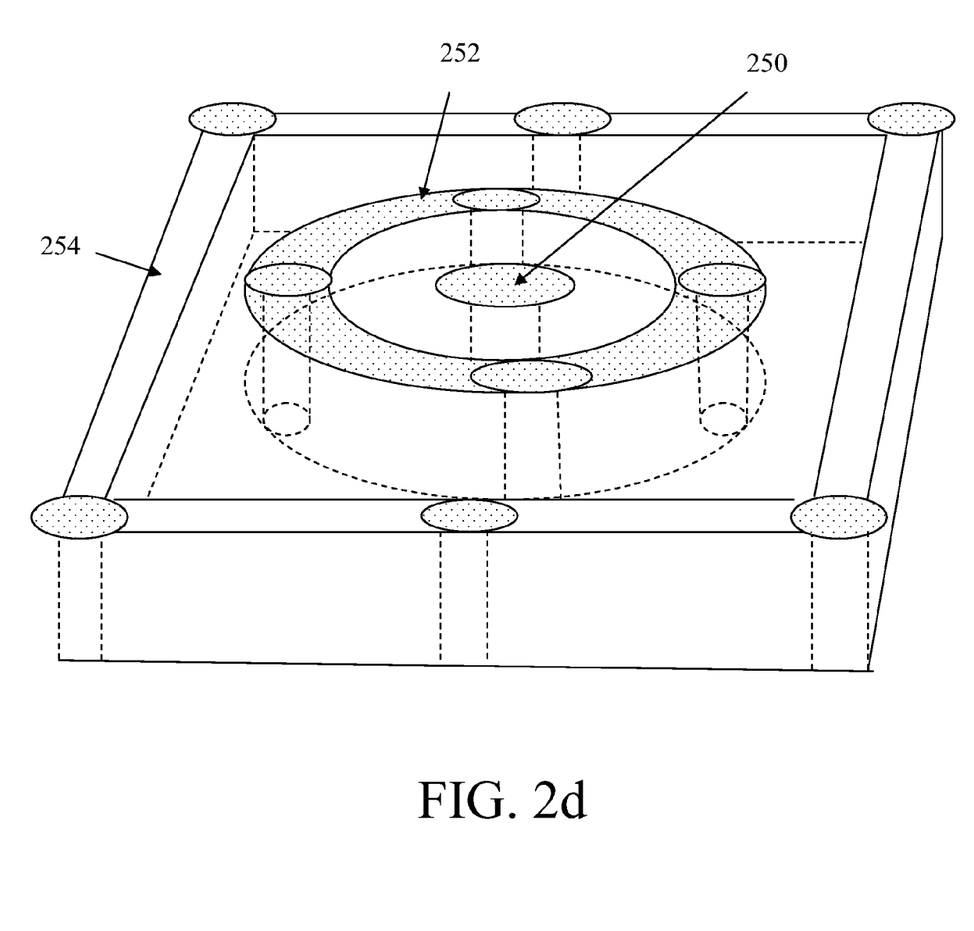
FIG. 2d illustrates yet another illustrative embodiment with a single signal pin and multiple ground rings.

FIG. 2d shows an embodiment with multiple ground rings, such as first concentric ground ring 252, and second concentric ground ring 254, encircling single signal pin 250.

Figure 2E:
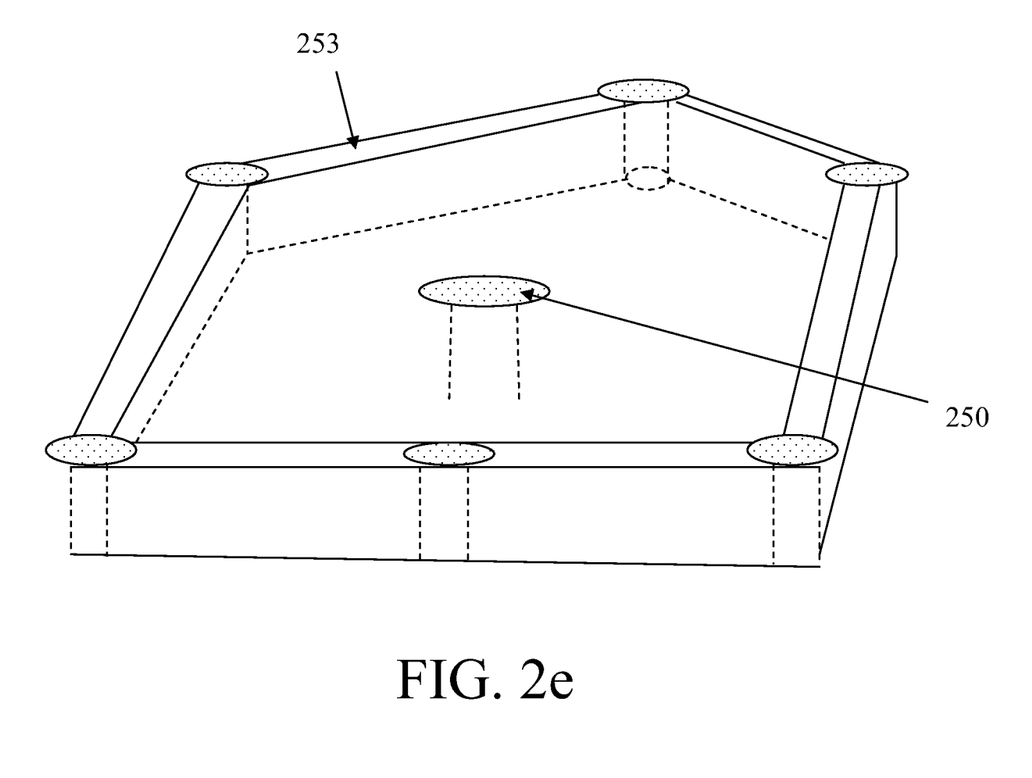
FIG. 2e illustrates an irregularly shaped ground ring encircling a signal pin, in accordance with still another illustrative embodiment.

FIG. 2e shows an embodiment with an irregularly shaped ground ring. Due to design and process constraints, it may not be practical to form the ground ring into a ring shape surrounding the signal pin, therefore an irregularly shaped ground ring may be implemented in accordance with the illustrative embodiment. Signal pin 250 is encircled by irregularly shaped ground ring 253.

Figure 3:
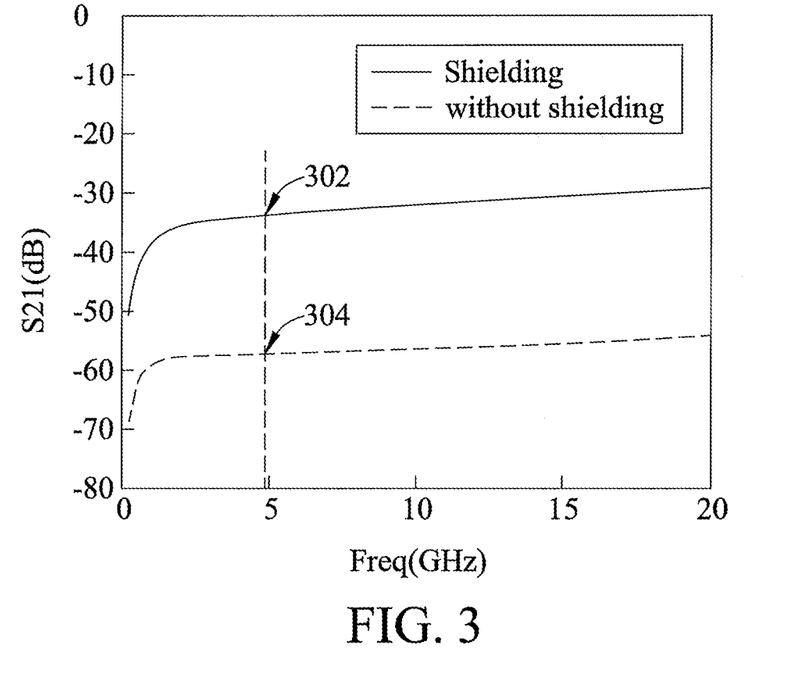
FIG. 3 is a graph of the s-parameter S21 for a two pin signal system with and without the ground ring.

Turning now to FIG. 3 a graph of s-parameter S21 for a two pin signal system with and without the ground ring is shown. The graph y-axis shows the S21 s-parameter (forward transmission gain coefficient). An s-parameter is a standard measure of crosstalk in a high frequency system. Scattering parameters or s-parameters are properties used to describe the electrical behavior of linear electrical networks when undergoing various steady state stimuli by small signals. Gain (g) is the voltage gain as a linear ratio of the output voltage divided by the input voltage. The scalar logarithmic expression (expressed in decibel dB) for gain is:

$$g = 20 \log|S_{21}| dB.$$

Therefore, $$S_{21}(dB) = 20 \log(V pin_1 / V pin_2)$$

The graph shows $S_{21}$ (dB) versus Freq (GHz). Curve 302 represents the data for the unshielded (no ground ring) system and curve 304 represents the data for the shielded (ground ring) system. At 5 GHz, curve 302 (unshielded) data indicates −34 dB=20 log(0.02). Also at 5 GHz, curve 304 (shielded) data indicates −57 dB=20 log(0.0014). The data indicates a clear reduction in crosstalk using the ground ring shielded signal pin of the present invention.

FIGS. 4a-4e depict cross-sectional views of layer formation steps for the method of manufacture of a signal pin shielded by a ground ring.

Figure 4A:
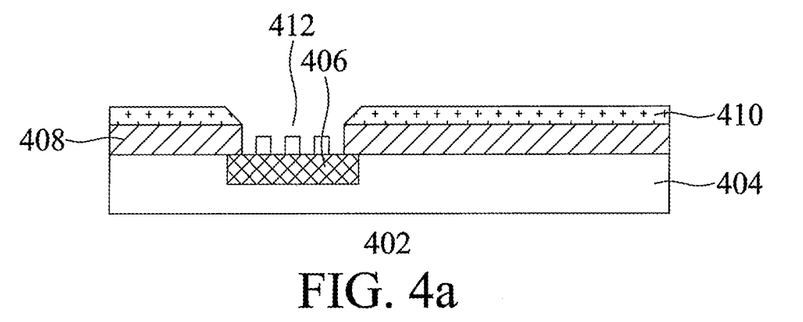
FIGS. 4a-4e are cross-sectional illustrations at selected formation steps for a method of manufacturing a signal pin shielded by a ground ring.

FIG. 4a shows passivation layer 404 over substrate 402, which includes top metal 406. Next dielectric layer 408 is deposited followed by first layer polyimide 410. First layer polyimide 410 is patterned and etched to form opening 412. Top metal 406 is partially exposed through opening 412.

Figure 4B:
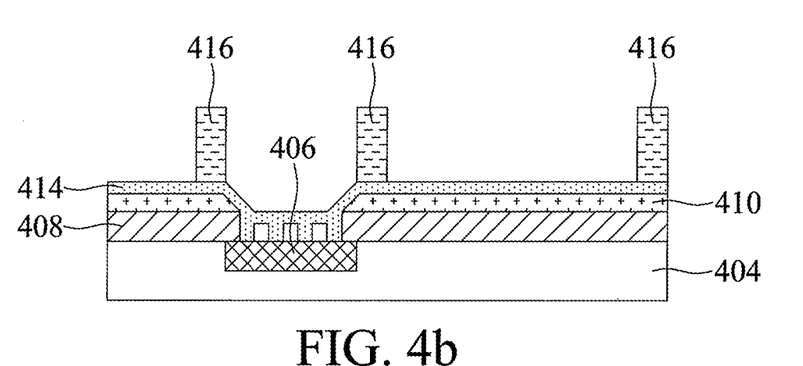

FIG. 4b shows the layers shown in FIG. 4a, such as top metal 406, first polyimide 410, and opening 412. A metal trace layer 414 is sputtered on substrate 402 as a seed layer for the electroplating process. Further, FIG. 4b depicts the patterned photoresist layer 416. Photoresist layer 416 is patterned to protect areas of substrate 402 that do not receive electroplating and is open in those areas requiring the electroplated metal. Photoresist layer 416 remains in place during the electroplating process.

Figure 4C:
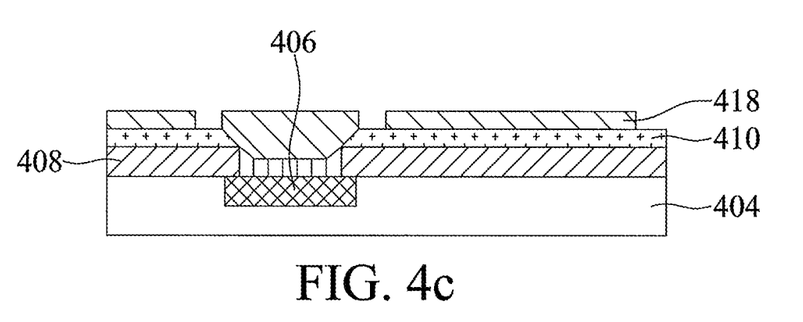

FIG. 4c shows the electroplated layer of Cu/Ni 418. Note that in cross-sectional view FIG. 4c, the photoresist layer 416 has been stripped. After photoresist strip, metal trace layer 414 was etched and cleared in the areas of the substrate that were protected by patterned photoresist layer 416. The remaining metal trace layer 414 was used to seed the electroplated Cu/Ni layer 418. A Cu/Ni metal is then electroplated onto the open areas of the substrate.

Figure 4D:
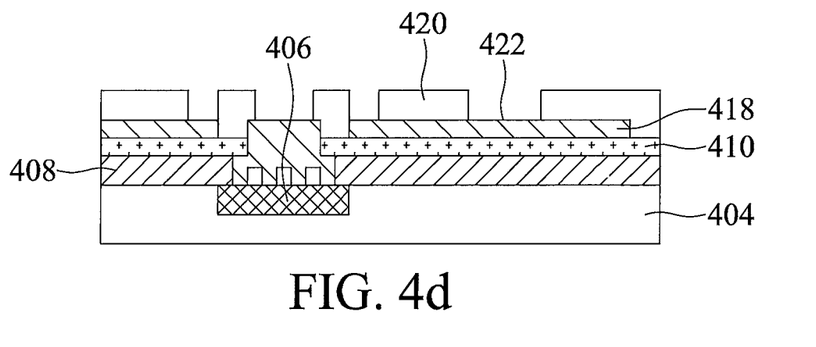

FIG. 4d shows a second polyimide layer 420 that has been patterned to form openings 422. The openings may receive an under bump metallurgy process before copper fill, not depicted.

Figure 4E:
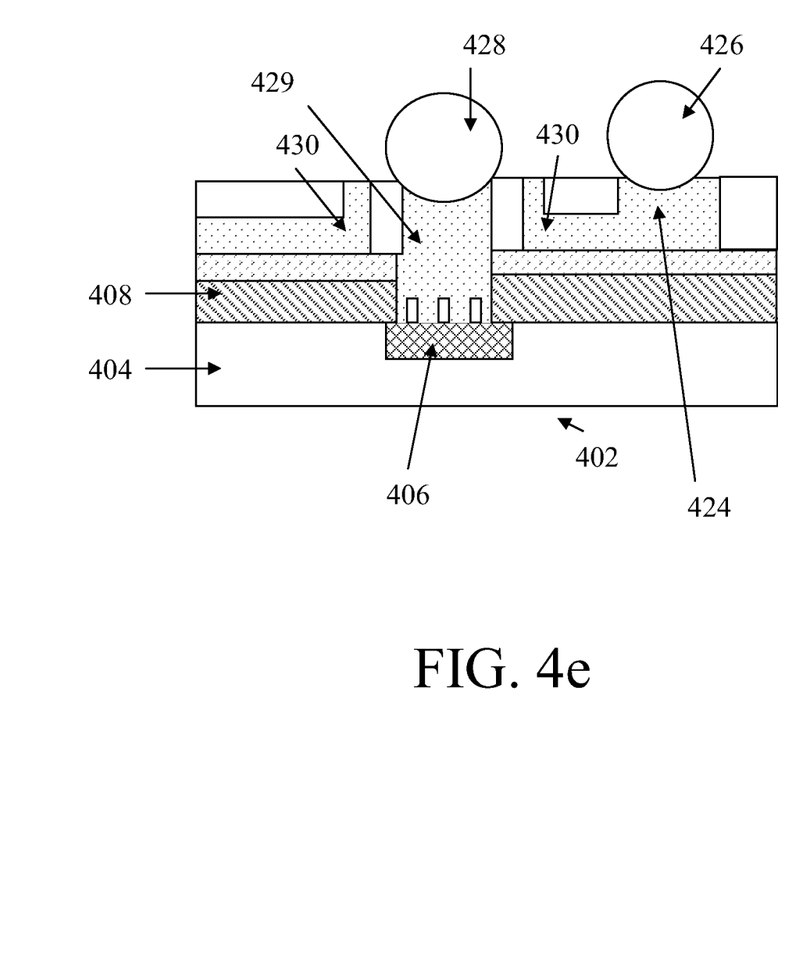

FIG. 4e shows a cross-sectional view of substrate 402 following the copper fill and bump processes. Openings 422 depicted in FIG. 4d are shown filled with copper in FIG. 4e, which form copper posts, including copper posts that form signal pin 429 and ground pin 424. The copper layer and posts may be formed by electroplating. In copper post technology, the bond pads are rerouted into an area array of interconnection points. In this technology, however, these interconnection points are in the form of electroplated copper posts, instead of pads. Signal pin 429 is depicted attached to solder ball 428 and ground pin 424 is depicted attached to solder ball 426. As can be seen by FIG. 4e, ground ring 430 attached to ground pin 424 makes a three dimensional shape into and out of the page encircling signal pin 429; thus, ground ring 430 is depicted on the left and right side of signal pin 429.

Copper posts, such as ground pin 424, may provide enough stand-off for the active wafer surface to be encapsulated in low-stress epoxy by transfer molding. Only the top portions of the posts, where the solder balls will be attached, are exposed. This is a WLCSP technology. Other metal systems and methods of deposition may be used; for example, an aluminum alloy deposition may be performed. Solder balls 426 and 428 are shown attached in FIG. 4e.

Figure 4F:
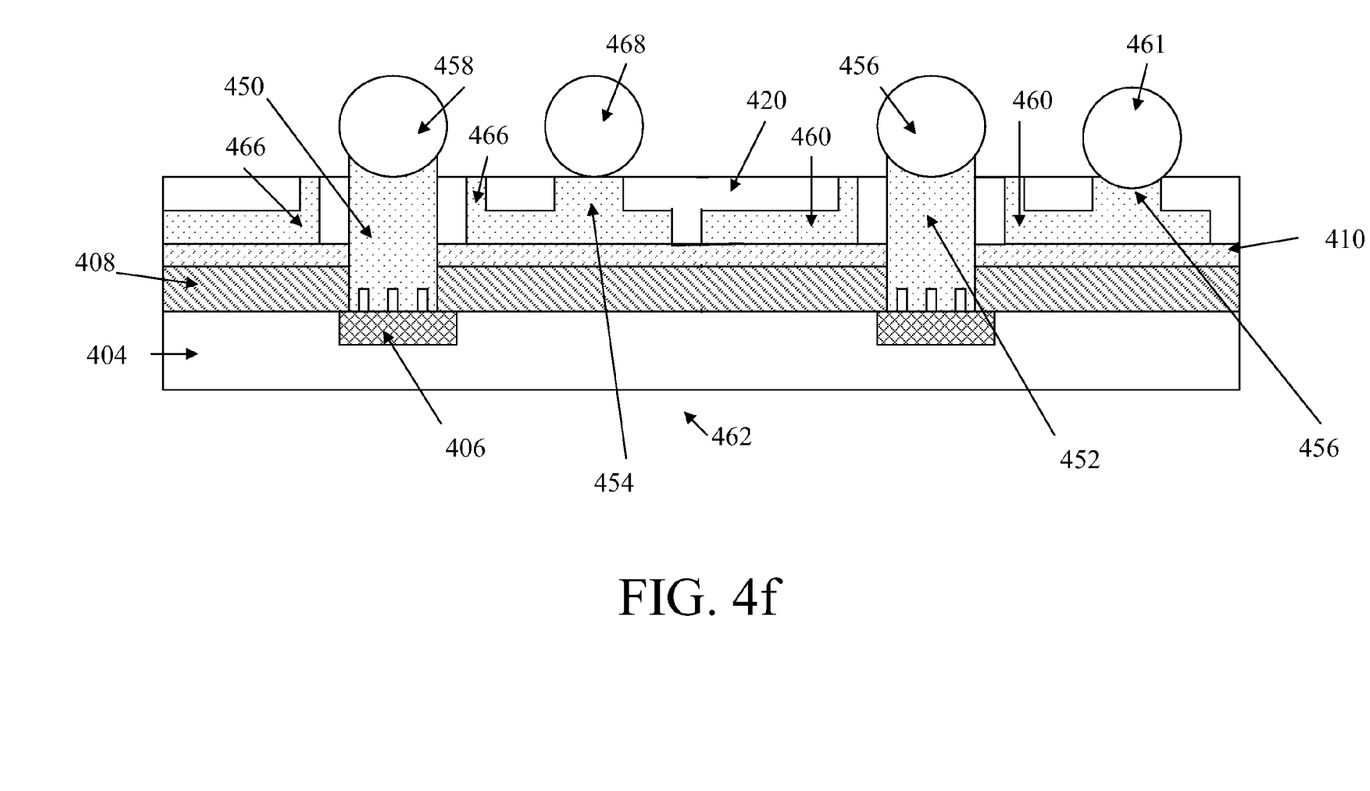
FIG. 4f illustrates a cross-sectional view of an embodiment with multiple signal pins and multiple ground rings on a signal substrate.

FIG. 4f shows an illustrative embodiment with multiple signal pins and ground rings on a substrate. Substrate 462 shows first signal pin 450, attached to solder ball 458 and second signal pin 452, attached to solder ball 456. First signal pin 450 is encircled by ground ring 466, which is attached to first ground pin 454, which is further attached to solder ball 468. Second signal pin 452 is encircled by ground ring 460, which is attached second ground pin 456, which is further attached to solder ball 461. The other layers, such as top metal 406, are labeled as in previous FIG. 4 depictions and will not be discussed further here.

Figure 4G:
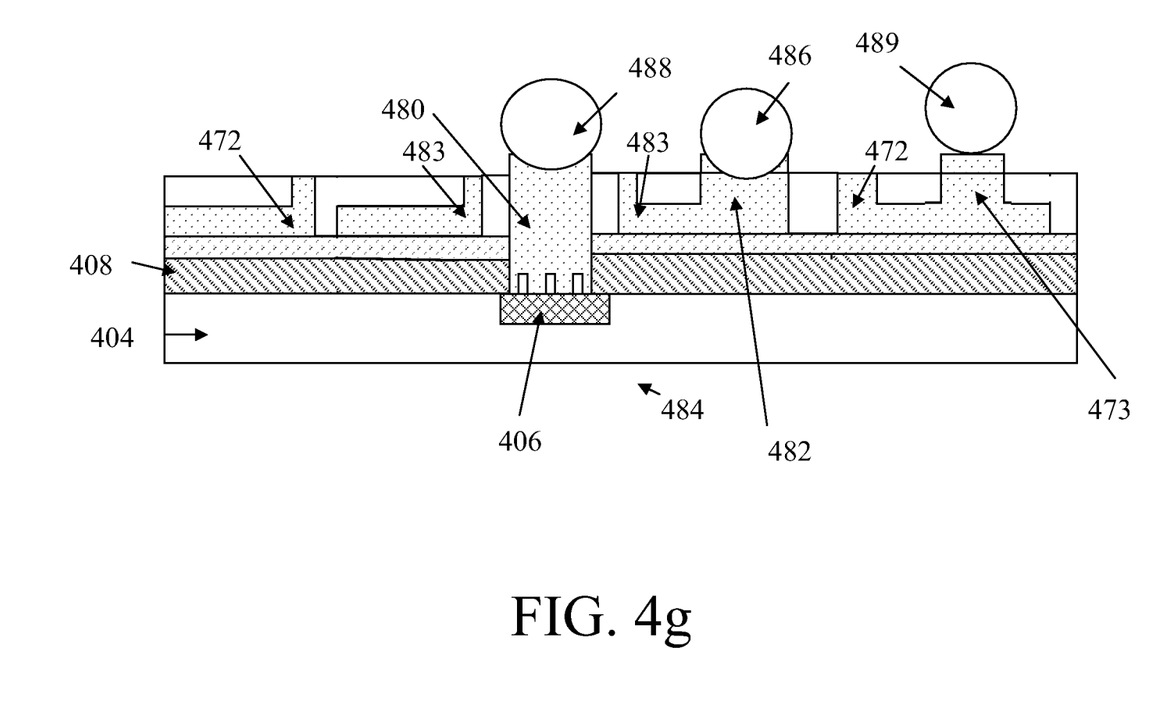
FIG. 4g illustrates a cross-sectional view of an embodiment with a single signal pin and multiple ground rings.

FIG. 4g shows an illustrative embodiment with multiple ground rings encircling a single signal pin. Substrate 484 depicts signal pin 480 attached to solder ball 488, first ground pin 482 attached to solder ball 486, and second ground pin 473 attached to solder ball 489. First ground pin 482 is a part of ground ring 483, shown on both the left and right side of signal pin 480. Ground ring 483 encircles signal pin 480 both going in and out of the page. Second ground pin 473 is a part of ground ring 472, shown on both the far left and far right side of signal pin 480. Ground ring 472, like ground ring 483, encircles signal pin 480 both going in and out of the page. The other layers, such as top metal 406, are labeled as in previous FIG. 4 depictions and will not be discussed further here.

Figure 4H:
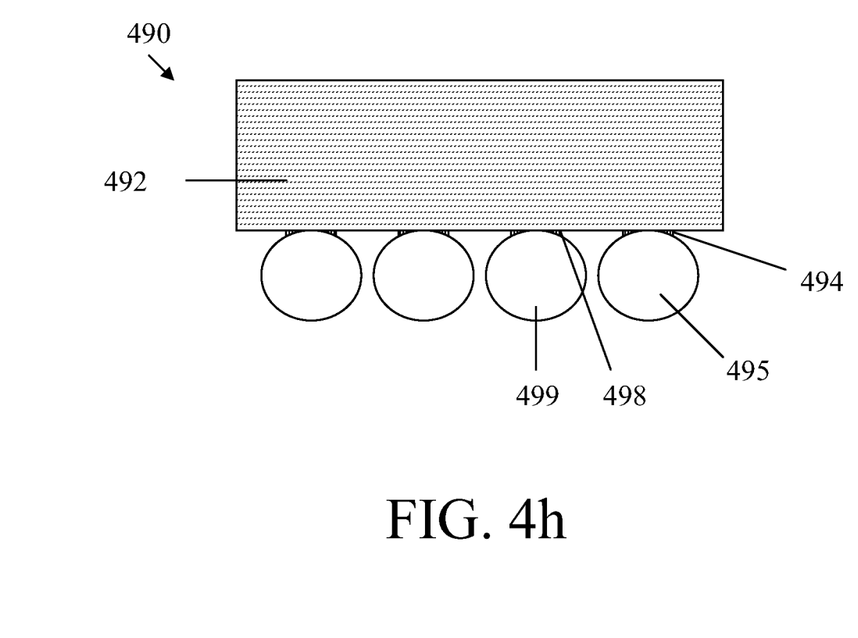
FIG. 4h shows an embodiment for a system for semiconductor.

FIG. 4h shows a system for a semiconductor in accordance with an illustrated embodiment. System 490 is a CSP semiconductor package comprising semiconductor substrate 492, ground pin solder ball 494, ground pin 495, signal pin solder ball 498, and signal pin 499. Substrate 492 is an inverted substrate and may be a substrate such as substrate 402 in FIG. 4e. Further, ground pin solder ball 495 may be attached to ground pin solder ball 494 and signal pin solder ball 499 may be attached to signal pin 498, such as signal pin 429 is depicted attached to solder ball 428 and ground pin 424 is depicted attached to solder ball 426 in FIG. 4e. Those of ordinary skill in the art will appreciate that many semiconductor devices, signal pins, and ground pins may be included in a single system (not shown).

Figure 5:
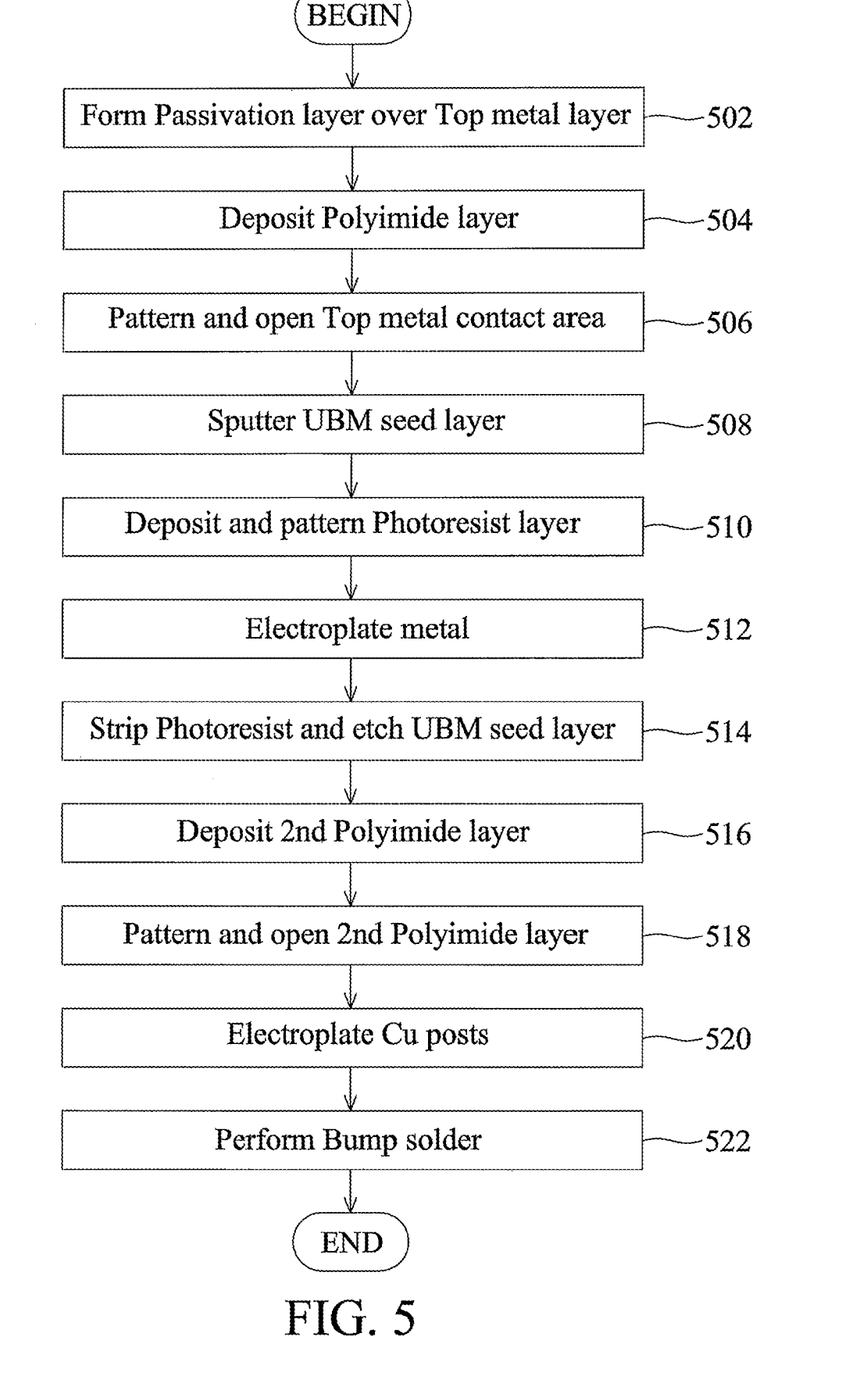
FIG. 5 is a process flow chart for a method of manufacturing a crosstalk-free, chip scale package (CSP) for high frequency applications.

FIG. 5 is a flow chart of an example process flow. The process begins with a passivation layer formed over the top metal layer (step 502). The first polyimide layer is deposited on the passivation layer (step 504). The passivation layer may be comprised of one layer or a plurality of layers. The polyimide layer is patterned and the polyimide and passivation layers are etched to open top metal regions (step 506). A metal trace layer is deposited as a seed layer (step 508). A layer of photoresist is deposited and patterned (step 510). The substrate undergoes an electroplating process, forming the post passivation interconnection metal layer (step 512). In an electroplating process, a thin layer of metal is plated on the surface of the biased wafer immersed in the electrolyte containing metal ions. As mentioned above a seed layer may have to be formed before electroplating. The previously deposited metal trace layer seeds the electroplating process. Al, Cu, and alloys thereof are examples of metal systems that may be used for step 512. The regions that are covered with photoresist are protected from the electroplating. It is during step 512 that the guard ring is formed.

Next the photoresist is stripped, followed by an etch of the exposed metal trace layer (step 514). The second layer of polyimide is deposited (step 516). The second layer of polyimide is patterned and etched (step 518). An under bump metallurgy (UBM) process is performed (step 520). The copper posts are then electroplated onto the substrate using the underlying UBM as a seed layer (step 522). A conventional bump process may follow (step 524), thus the process ends. Solder bumps may be formed or placed on the substrate in many ways, including evaporation, electroplating, printing, jetting, stud bumping, and direct placement. The results of these methods may differ in bump size and spacing ("pitch"), solder components and composition, cost, manufacturing time, equipment required, assembly temperature, and metal trace layer.

An illustrative embodiment may be used in a variety of packages; for example, a chip scale package (CSP) or a flip chip package. An illustrative embodiment may also be packaged at the wafer level, forming a wafer level chip scale package (WLCSP).

Although the present invention and its advantages have been described in detail, it should be understood that various changes, substitutions, and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that the metal system may be varied while remaining within the scope of the present invention. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A cross-talk free structure comprising:
   a substrate having a passivation layer thereon, the substrate comprising an integrated circuit coupled to a top metal contact, the top metal contact being exposed through the passivation layer, one or more dielectric layers on the passivation layer;
   a signal pin extending through the one or more dielectric layers to the top metal contact, the signal pin being exposed through the one or more dielectric layers for coupling a solder bump, the signal pin configured to receive an external signal;
   a ground ring formed in the one or more dielectric layers and spaced from the signal pin by a portion of the one or more dielectric layers, the ground ring having a portion exposed through the one or more dielectric layers, the ground ring encircling the signal pin and the end of the signal pin;
   a grounded solder bump coupled to the ground ring; and
   a package selected from a CSP (chip scaled package) and a WLCSP (wafer level chip scaled package), wherein the structure is implemented in the package.

2. The structure of claim 1, wherein the signal pin comprises a signal pin material chosen from a group consisting essentially of Al PPI (post passivation connection), Cu PPI, and alloys thereof.

3. The structure of claim 2, wherein the signal pin material is a Cu post structure.

4. The structure of claim 1, wherein the ground ring is a shape encircling the signal pin that is not centered at the signal pin.

5. The structure of claim 1, wherein the ground ring is a plurality of rings.

6. A system for a semiconductor device package, the system comprising:
   a substrate having various layers and structures forming an integrated circuit;
   a plurality of top metal contacts on the substrate;

one or more dielectric layers on the substrate, the plurality of top metal contacts being exposed through the one or more dielectric layers;
a plurality of signal pins disposed on respective ones of the top metal contacts;
the plurality of signal pins coupled with the integrated circuit by respective ones of the plurality of top metal contacts, each signal pin configured to receive an external signal;
each of the plurality of signal pins and the end of each of the plurality of signal pins encircled with a corresponding ground ring disposed in the one or more dielectric layers and exposed at the surface the one or more dielectric layers, the ground rings spaced from the respective signal pins by a portion of the one or more dielectric layers;
each of the corresponding ground rings coupled with a grounded solder bump; and
a package selected from a CSP (chip scaled package) and a WLCSP (wafer level chip scaled package), wherein the system is implemented in the package.

7. The system of claim 6, wherein each of the signal pins comprises a signal pin material chosen from a group consisting essentially of Al PPI (post passivation connection), Cu PPI, and alloys thereof.

8. The system of claim 6, wherein the plurality of signal pins are comprised of Cu post structures.

9. The system of claim 6, wherein the corresponding ground rings are of a shape encircling the corresponding signal pin but not centered on the signal pin.

10. The system of claim 6, wherein the corresponding ground rings are of dissimilar shapes to each other.

11. The system of claim 6, wherein the corresponding ground rings are chosen from a group consisting essentially of a single ring, multiple rings, and wherein the corresponding ground rings comprise a combination of single and multiple rings.

* * * * *